(12) United States Patent
Lei et al.

(10) Patent No.: US 7,904,853 B1
(45) Date of Patent: Mar. 8, 2011

(54) PATTERN SIGNATURE (75) Inventors: Junjiang Lei, Bellevue, WA (US); Srini Doddi, Fremont, CA (US); Weiping Fang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 236 days.

(21) Appl. No.: 11/965,680

(22) Filed: Dec. 27, 2007

(51) Int. Cl.
*G06F 17/50* (2006.01)

(52) U.S. Cl. ............ 716/52; 716/50; 716/51; 716/55; 716/56; 716/136; 430/5; 430/30; 382/144; 382/145

(58) Field of Classification Search .......... 716/3–5, 716/19–21, 50, 51, 52, 55, 56, 136; 382/141–152; 430/5, 30
See application file for complete search history.

(56) References Cited

U.S. PATENT DOCUMENTS

| | | | |
|---|---|---|---|
| 5,815,685 A | 9/1998 | Kamon | |
| 6,187,483 B1* | 2/2001 | Capodieci et al. | ............... 430/5 |
| 6,453,274 B2 | 9/2002 | Kamon | |
| 6,883,158 B1 | 4/2005 | Sandstrom et al. | |
| 7,386,162 B1 | 6/2008 | Dakshina-Murthy et al. | |
| 7,403,265 B2 | 7/2008 | Tinnemans et al. | |
| 7,444,616 B2 | 10/2008 | Sandstrom et al. | |
| 7,512,927 B2 | 3/2009 | Gallatin et al. | |
| 7,530,048 B2 | 5/2009 | Joshi | |
| 7,566,517 B1 | 7/2009 | Adel et al. | |
| 7,646,906 B2 | 1/2010 | Saidin et al. | |
| 7,689,966 B2 | 3/2010 | Verma et al. | |
| 7,695,876 B2 | 4/2010 | Ye et al. | |
| 7,739,651 B2 | 6/2010 | Melvin et al. | |
| 2004/0003357 A1* | 1/2004 | Palusinski et al. | ............... 716/5 |
| 2004/0086197 A1* | 5/2004 | Fletcher et al. | ............... 382/276 |
| 2005/0251771 A1 | 11/2005 | Robles | |
| 2006/0228041 A1 | 10/2006 | Joshi | |
| 2006/0277520 A1* | 12/2006 | Gennari | ............... 716/21 |

OTHER PUBLICATIONS

Genarri, Frank E. et al., "A Pattern Matching System for Linking TCAD and EDA." Proceedings of the 5th International Symposium on Quality electronic Design, pp. 165-170, 2004.
Roseboom, E. et al., "Automated Full-Chip Hotspot Detection and Removal Flow for Interconnect Layers of Cell-Based Designs." SPIE 2007.
Non-Final Office Action dated Oct. 4, 2010 for U.S. Appl. No. 11/952,912.

* cited by examiner

*Primary Examiner* — Paul Dinh
*Assistant Examiner* — Nha T Nguyen
(74) *Attorney, Agent, or Firm* — Vista IP Law Group LLP

(57) ABSTRACT

A method, system, and computer program product are disclosed for generating a pattern signature to represent a pattern in an integrated circuit design. In one approach, the method, system and computer program product transform pattern data, two dimensional data for the pattern, into a set of one dimensional mathematical functions, compress the set of one dimensional mathematical functions into a single variable function, compress the single variable function by calculating a set of values for the single variable function, and generate a pattern signature for the pattern from the set of values.

18 Claims, 8 Drawing Sheets

(Prior Art)

PATTERN SIGNATURE

BACKGROUND

In the Integrated Circuit (IC) design, electronic components and wiring are represented by a set of geometric shapes and patterns from a physical perspective. A pattern is a set of polygon features in an area of an IC design. Electronic design automation (EDA) tools interact with these shapes and patterns throughout the IC design and verification process. For example, the patterns and shapes in the design are routinely checked with the Design Rules—Design Rules Checking (DRC). Design rules are a series of parameters provided by semiconductor manufacturers, specifying geometric and connectivity restrictions to ensure sufficient margins to account for variability in semiconductor manufacturing processes. DRC enables a designer to verify the correctness of his or her design and to achieve a high overall yield and reliability for the design.

However, when the lithography process reaches 65 nm and below, mere reliance on DRC may no longer be sufficient to ensure acceptable yields. One solution is the application of Lithography Process Checking (LPC). LPC simulates the actual lithography process on the design data to predict the eventual printed pattern on a silicon wafer. But lithography simulations are often costly and time-consuming. It is highly desirable to limit the number of simulations that must be performed for each design process. Patterns and shapes previously verified by lithography simulations could be stored in a database for the future use. When an EDA tool encounters a pattern, it may search the database for a matched pattern before conducting the expensive lithography simulations. If the search result turns out to be positive, then no simulation will be needed for this pattern. Pattern analysis and matching play an important role in this approach.

Figure 1:
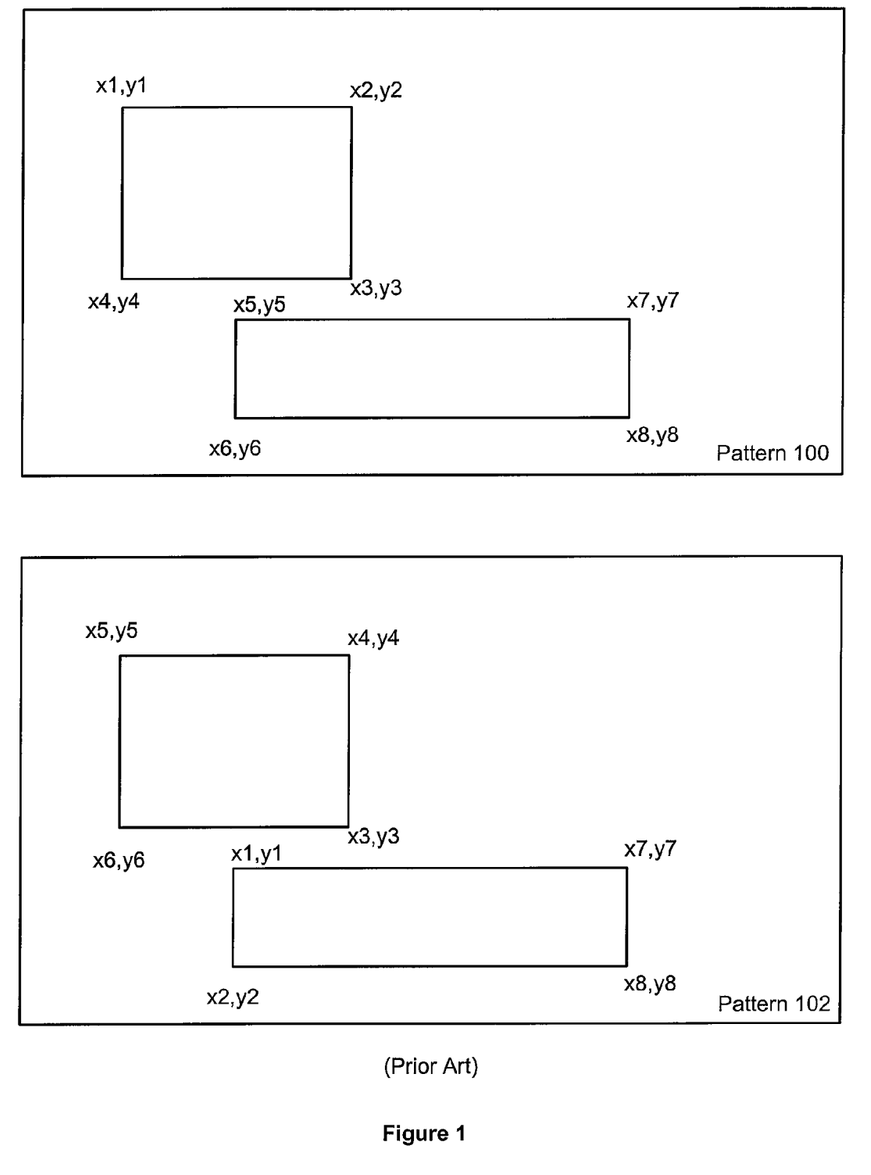
FIG. 1 illustrates the need for sorting in an approach for pattern matching.

Pattern matching is the matching of all polygons and their vertices between two patterns. FIG. 1 illustrates the need for sorting in an approach for pattern matching. Although Pattern 100 and Pattern 102 are identical patterns, the vertices must be sorted or reordered such that the similarities between the patterns can be identified. For example, (x1,y1) of Pattern 100 does not match (x1, y1) of Pattern 102 but (x1,y1) of Pattern 100 does match (x5, y5) of Pattern 102. Therefore, the vertices in Pattern 100 and Pattern 102 need to be sorted so that the similarities between the patterns are apparent. However, the sorting and comparison approach results in an expense on the order of n log n, where n is the number of vertices of the objects in a pattern. Further, a large amount of memory is required to store all of the vertices for large patterns in order to perform the comparisons alone. Thus, there is a need to reduce the cost involved in pattern matching with improved pattern signatures.

SUMMARY OF THE INVENTION

A method, system, and computer program product are disclosed for generating a pattern signature to represent a pattern in an integrated circuit design. In one approach, the method, system and computer program product transform pattern data, two dimensional data for the pattern, into a set of one dimensional mathematical functions, compress the set of one dimensional mathematical functions into a single variable function, compress the single variable function by calculating a set of values for the single variable function, and generate a pattern signature for the pattern from the set of values.

BRIEF DESCRIPTION OF THE DRAWINGS

The invention is illustrated by way of example and not limitation in the figures of the accompanying drawings, in which like references indicate similar elements and in which.

DETAILED DESCRIPTION

Figure 2:
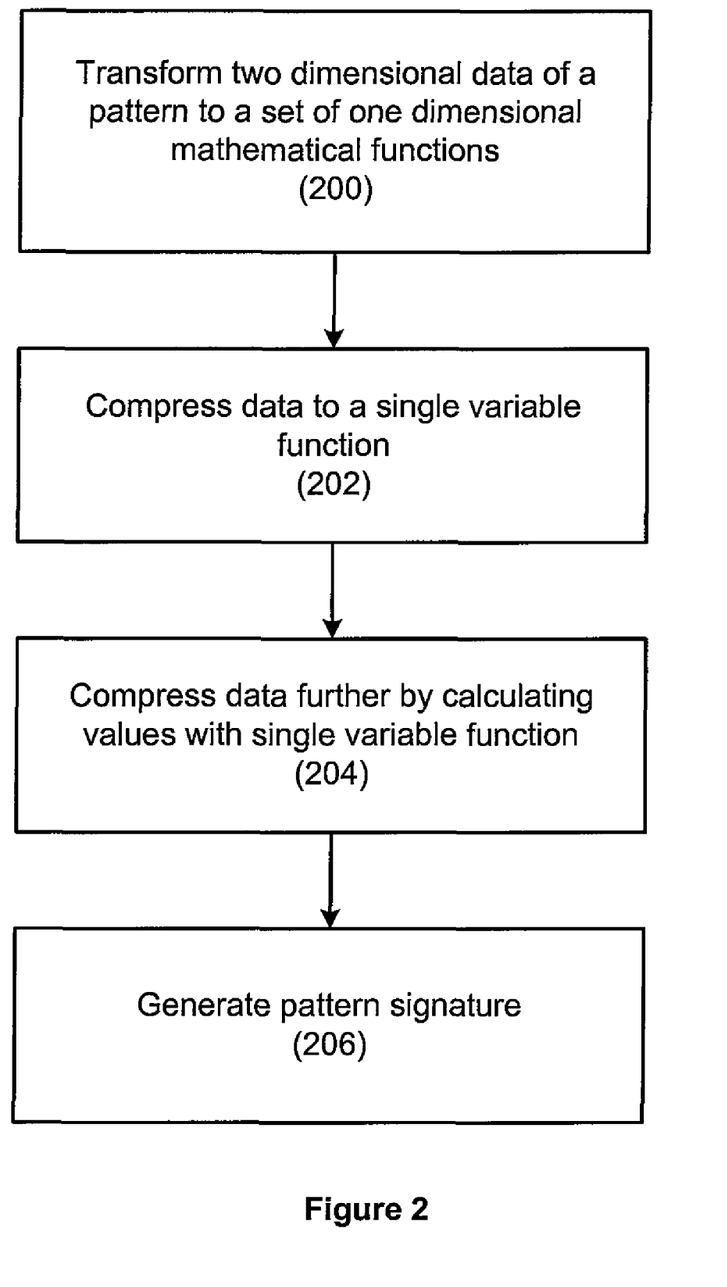
FIG. 2 is a flowchart of an approach for generating a pattern signature.

The present invention is directed toward methods, systems, and mediums for generating pattern signatures. Embodiments of the present invention implement representations of design patterns with a pattern signature. The pattern signature may then be used to facilitate pattern matching of patterns in IC designs. The pattern signature provides the ability to quickly identify or match similar patterns in IC designs without the need to sort the vertices of the geometric objects or shapes in the patterns. The pattern signature, likewise, provides the ability to retrieve application or simulation results for similar patterns in an IC design. Further, the generation of pattern signatures provides the ability to calculate a metric for measuring the differences between two patterns, representing IC designs. FIG. 2 is a flowchart of an approach for generating a pattern signature. Initially, two dimensional data for a pattern is transformed to a set of one dimensional mathematical functions (200). In one or more embodiments, the transformation from two dimensional data to one dimensional mathematical functions is accomplished by taking projections of the geometric objects in the pattern for all axes in a number of different directions. In some embodiments, the projections are determined by performing a Radon Transform. The number of different directions used in performing the projections with a Radon Transform may vary depending on the intended application of for the pattern signature.

Next, after the two dimensional data for a pattern is transformed to a set of one dimensional functions (200), the data is compressed by reducing the number of functions used to represent the pattern (202). In one or more embodiments, a non-linear combination is performed to reduce the number of functions that represent the pattern to a single variable function or univariate function. For example, if two different projections are taken for the pattern resulting in two different functions, then a non-linear combination is performed to reduce the eight functions to one single variable function. In the case of two projections for a pattern, the resulting non-linear combination is as follows: $F(x)=[f_1(x)]^2+[f_2(x)]^2$.

The single variable function may then be further compressed into a set of numbers or values (204). In one or more embodiments, the moment method is used to calculate a set of numbers. A moment of a single variable function may be a sum or integral of the single variable function. For example, the 0th moment is $m_0=\int_a^b f(x)dx$, the 1st moment is $m_1=\int_a^b xf$ (x)dx, the 2nd moment is $m_2 = \int_a^b x^2 f(x) dx$, and so on. The numbers or values that result from the moments may be used in generating a signature for the pattern. The number of moments for the single variable function that are used for the pattern signature vary based upon the application for the pattern signature. In one or more embodiments, if the desired application is pattern interpolation, nine to thirty values from utilizing the moment method may be necessary. In some embodiments, machine learning may be used to determine the most efficient number of moment values to use for each application.

Next, the set of values or numbers may be used to generate a pattern signature (206). The amount of numbers necessary for the signature may vary depending on the application for the signature. Experimentation or in some cases, machine learning may be necessary to determine how many numbers are necessary for the pattern signature depending on the particular application.

An embodiment for creating pattern signatures will now be described in mathematical terms. A polygon (point list) may be viewed as a mathematical sequence V of two-dimensional vectors, i.e., V={(x1, y1), . . . , (xN, yN)}. The pattern signature may be viewed as an operator M mapping V to scalar s, M: V→s. The operator M may be defined as a non-linear transform, composite of projections, bi-linear operation and moment method.

First, a projection operator P mapping 2-D vectors to a scalar, P: v=(x, y)→t, where x, y, t are real numbers. The projection can be characterized with a normal vector and a shift. Applying the projection P to a sequence of 2-D vectors V={(x1, y1), . . . , (xN, yN)}, a sequence of real numbers T={t1, . . . , tN}, namely, PV=T may be obtained.

In order to emphasize that a polygon is an ordered sequence of pairs of x, y coordinates, a nonlinear operator B is defined as follows. Let Q be a permutation transform, which may be given, for instance, by the rule: Q: {1, 2, . . . , N}→{3, 4, . . . , N, 1, 2}. With such a permutation, the 2D sequence V, or scalar sequence T may be permuted. It may be verified that Q commutes with P, QPV=PQV=QT. Let us write QT=T'={t1', . . . , tN'}. The operator B may be defined by B(PV)=PV.*QPV, where the notation .* means point wise multiplication, adopted from the Matlab convention. In short, B(PV)={s1, s2, . . . , sN} with s1=t1*t1', . . . , sN=tN*tN'. Finally, the components in the final sequence B(PV) are summed up to produce a single scalar s, s=sum of all s1, s2, . . . sN. The number is a feasible signature of the 2D sequence V, or that of the polygon represented by V. In practice, a pattern is generally made of many polygons and the sum of the feasible signatures of these polygons may be the feasible signature of the pattern.

Possible applications for the pattern signatures may include any case in which it is necessary to identify, match, or compare patterns. Pattern matching can be used to retrieve simulation results for a portion of an IC design that is identified as being a hot spot or near a hot spot in the IC design. A hot spot is a marker designating a place that is an area of concern in the IC design. A hot spot may be an issue with the layout configuration of an IC design, usability of an IC design or manufacturability of an IC design. A pattern signature with a set of numbers may be compared with other pattern signatures to determine whether patterns for IC design are similar to each other. The use of a pattern signature to compare patterns may greatly reduce the time necessary to perform comparisons in prior approaches. For example, instead of comparing vertices of geometric objects in a pattern one by one, the numbers of the pattern signatures may be quickly compared. Further, the comparison of pattern signature as opposed to vertices allows for a reduction in storage used because the pattern signature consisting of a set of numbers requires less space in some cases then the set of vertices for all of the geometric objects in the pattern.

Additionally, the use of pattern signatures reduces the need for sorting of the geometric objects before beginning a pattern comparison. As described above in FIG. 1, ordinarily the polygons or geometric shapes would have to be sorted prior to performing any comparison of the polygons and the sorting and comparison approach results in an expense on the order of n log n. A benefit of the generation of a pattern signature, as described above, may be that sorting is not required in order to perform comparisons.

The generation of pattern signatures, as described above, provides the ability to calculate a metric for measuring the differences between two patterns, representing IC designs. For example, the Euclidean distance can been calculated to measure the difference between the pattern signature w1, w2 for pattern W and pattern signature j1, j2 for pattern J with squareroot(($w1-j1)^2+(w2-j2)^2$). If a pattern is known to be a good pattern and the distance between the known good pattern signature and another pattern signature is below a certain threshold, then the pattern may likewise be a good pattern. Similarly, if a pattern is known to be a bad pattern, a pattern with known lithographic issues, and the distance between the known bad pattern signature and another pattern signature is below a certain threshold, then the pattern may likewise be a bad pattern. In some cases, the calculated distance metric may not be within a threshold such that the distance metric has proven to be inconclusive and therefore the success or failure of the pattern is not known.

Figure 3:
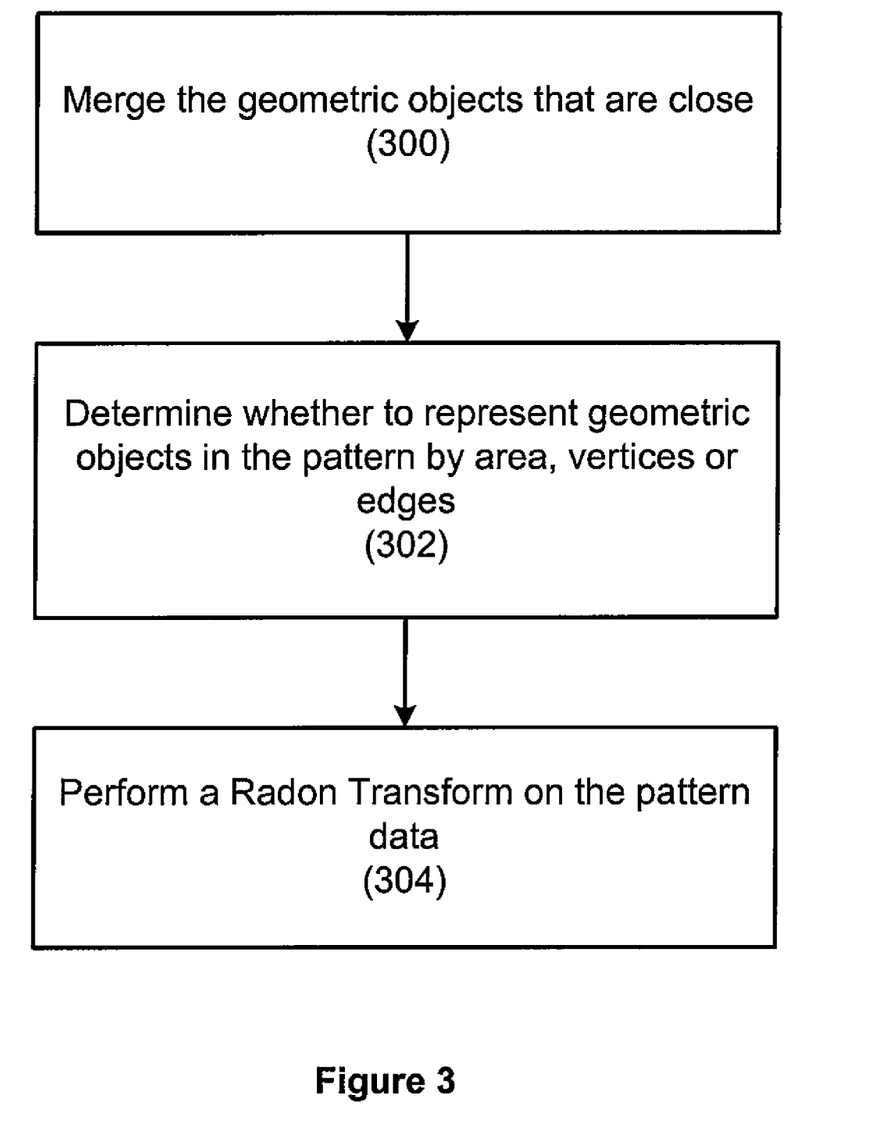
FIG. 3 is a flowchart of an approach for transforming two dimensional data of pattern to a set of one dimensional mathematical functions.

FIG. 3 is a flowchart of an approach for transforming two dimensional data of pattern to a set of one dimensional mathematical functions. In one or more embodiments, the transformation from two dimensional data to one dimensional mathematical functions is accomplished by taking projections of the geometric objects in the pattern for all axes in a number of different directions. Before taking the projections for the pattern, the geometric objects in the pattern that are in close proximity to each other may be merged into one object to facilitate the generation of a pattern signature (300).

Figure 4A:
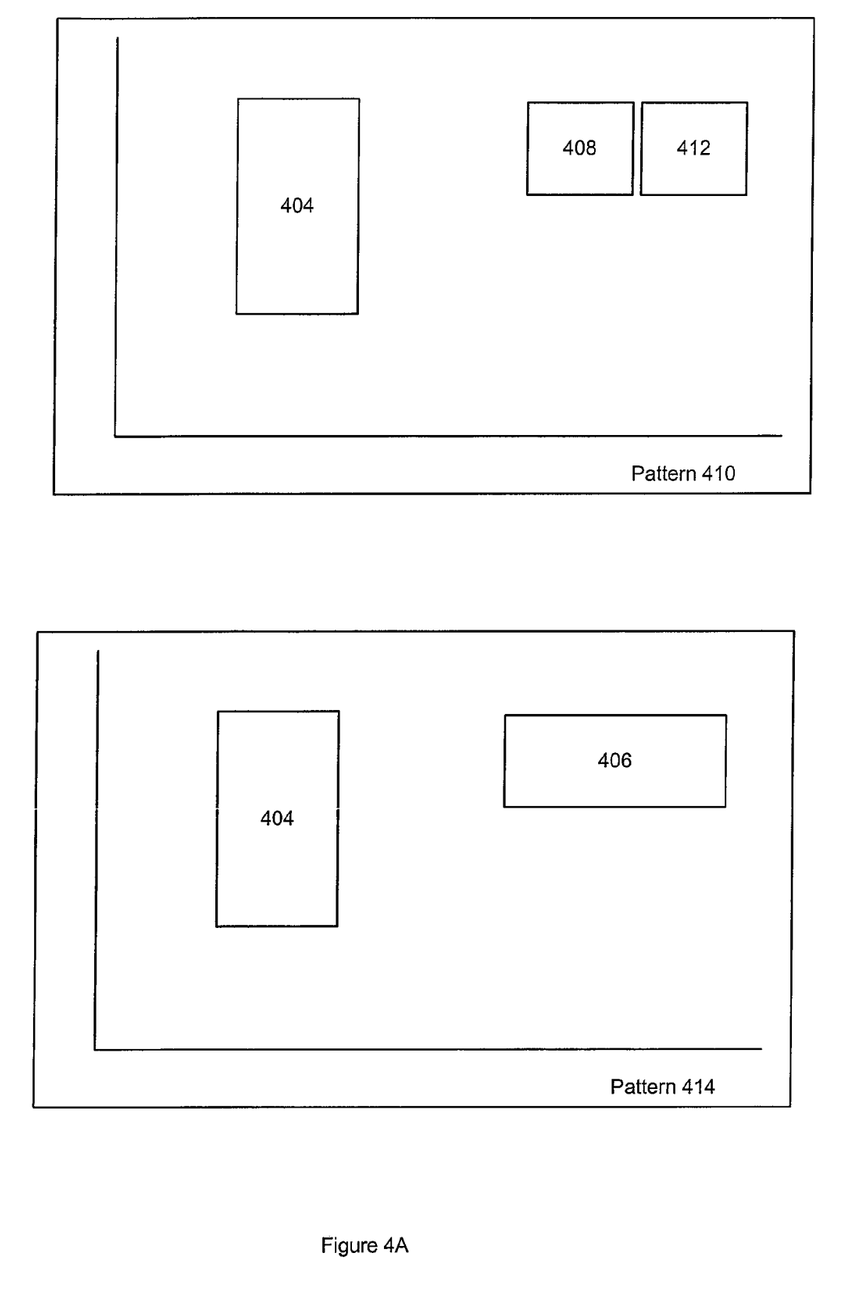
FIG. 4A shows an example of merging shapes of a pattern.

FIG. 4A shows an example of merging shapes of a pattern. In FIG. 4A, Pattern 410 has geometric shapes 408 and 412 that are in close proximity to each other. Pattern 414 shows the merging of 408 and 412 into one geometric shape or object 406 to facilitate the generation of a pattern signature (300).

Figure 4B:
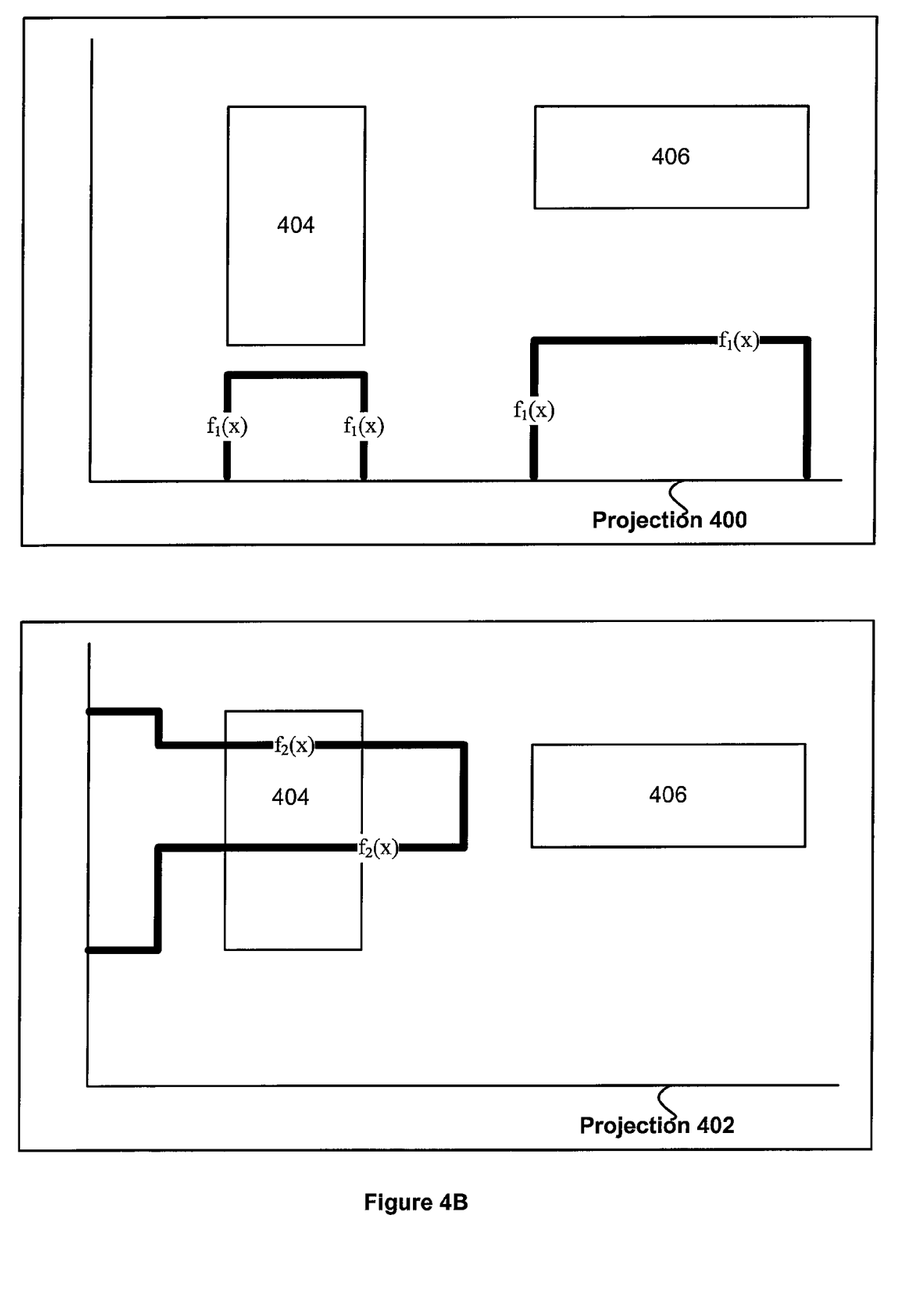
FIG. 4B shows an example of transforming two dimensional data to one dimensional functions.

Next, a determination is made as to whether to represent the geometric objects in the pattern with projections that account for the area under the geometric objects, the vertices for the geometric objects, or the edges of the geometric objects (302). FIG. 4B shows an example of transforming two dimensional data into one dimensional functions that account for the area under the geometric objects. In FIG. 4B, a determination was made to represent the geometric object in the pattern by the area under the geometric objects in the pattern. As such, a transformation of the two-dimensional data in the pattern used in FIG. 4B produces a Projection 400 with function $f_1(x)$ representing the pattern with geometric objects 404 and 406. A second projection, Projection 402, is shown in FIG. 4B for the geometric objects in the pattern with $f_2(x)$.

Figure 5:
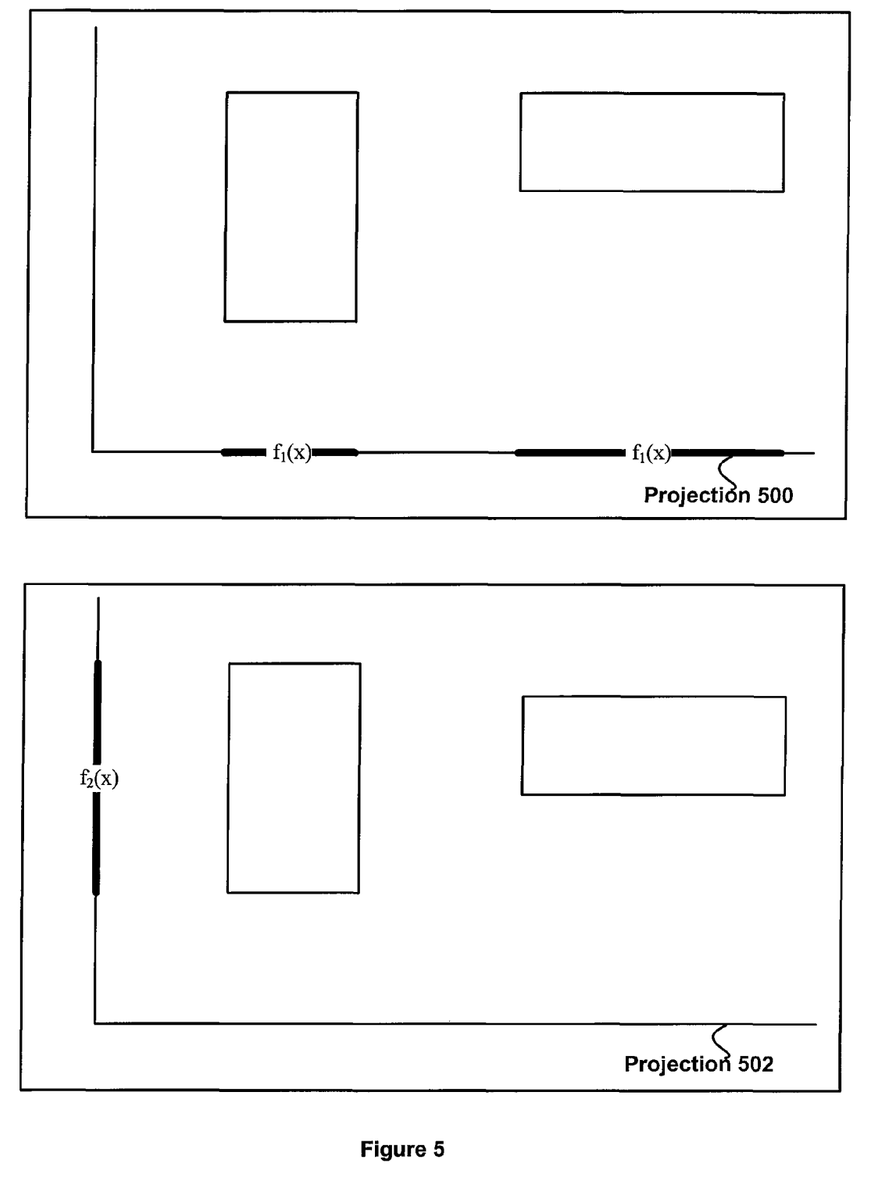
FIG. 5 shows an example of transforming two dimensional data to one dimensional functions.

FIG. 5 shows an example of transforming two dimensional data into one dimensional functions. In FIG. 5, a determination was made to represent the geometric object in the pattern with the edges of the geometric objects in the pattern. As such, a transformation of the two-dimensional data in the pattern used in FIG. 5 produces a Projection 500 with function $f_1(x)$ representing the pattern with geometric objects 504 and 506. A second projection, Projection 502, is shown in FIG. 5 for the geometric objects in the pattern with $f_2(x)$.

Continuing with FIG. 3, after a determination is made as to whether to represent the geometric objects in the pattern using the area, vertices or edges, the two dimensional data for a pattern is transformed into a set of one dimensional mathematical functions with the use of Radon Transform. A Radon Transform is a transformation from two dimensional data to a set of one dimensional mathematical functions that is accomplished by taking projections of the geometric objects in the pattern for all axes in a number of different directions (304). The number of different directions used to produce the set of functions may be chosen randomly or determined after experimentation.

Figure 6:
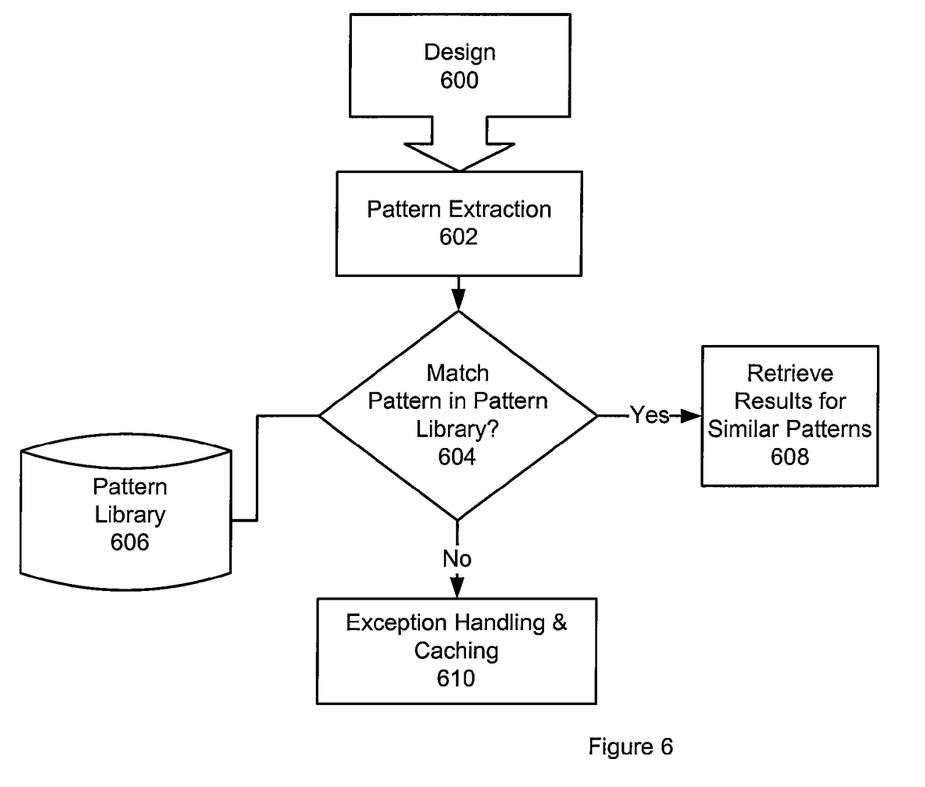
FIG. 6 is a flowchart that illustrates lithography hot spot checking.
Figure 7:
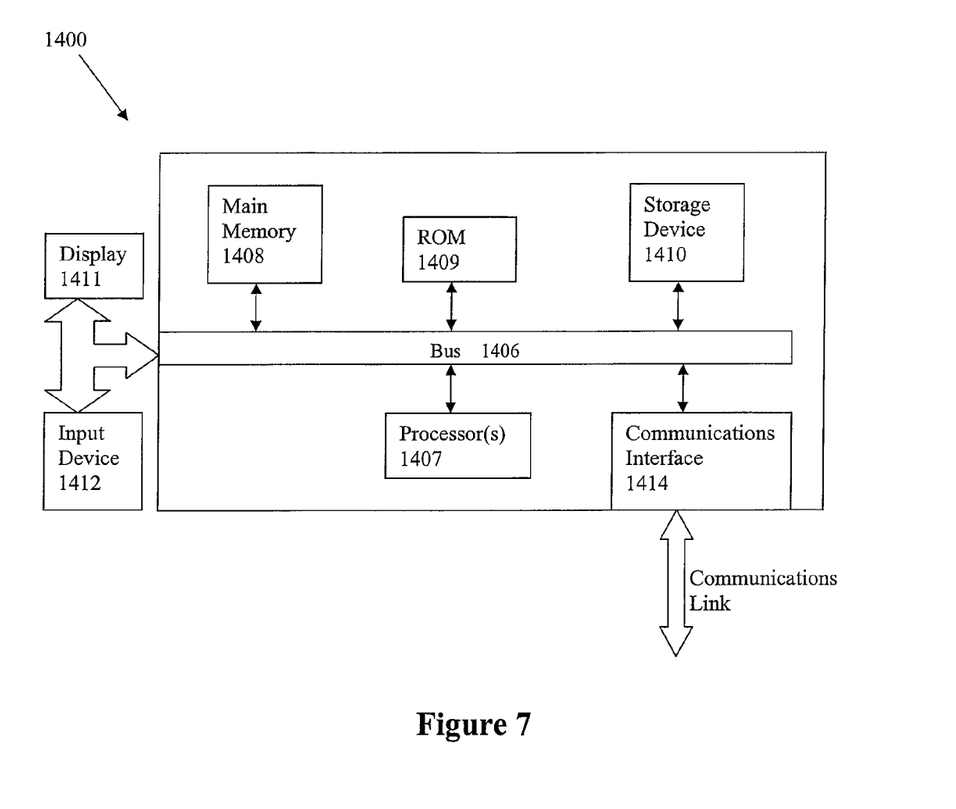
FIG. 7 shows an architecture of an example computing system with which the invention may be implemented.

An application for pattern signatures of lithography hot spot checking will now be described. FIG. 6 is a flowchart that illustrates lithography hot spot checking. First, an IC Design Layout 600 is provided to a Pattern Extractor 602, which extracts patterns from an IC design for pattern matching. In one or more embodiments, a Pattern Extractor 602 is a rule based procedure which identifies all possible hot spot locations in an IC Design Layout 600. After a hot spot is identified with the Pattern Extractor 602, the pattern may be extracted by over sizing each potential hot spot with a litho halo (e.g. 1.2 microns) and then performing a Boolean AND with the oversized result and the polygons on the target layer, a layer representing the polygons that are desired to be printed. Those skilled in the art will recognize that there are many methods for hot spot identification. Next, Pattern Matching 604 is performed between the extracted pattern and the patterns in the Pattern Library 606 using the pattern signatures as described above. If the extracted pattern matches a pattern in the Pattern Library 606, then the application results (e.g. simulation results, OPC results, and or hot spot scores) associated with the pattern may be retrieved from the Pattern Library 606.

Alternatively, if the extracted pattern does not match a pattern in the Pattern Library 606, then exception handling and caching may be performed 610. The pattern and associated application results may be added to the Pattern Library 606. The pattern may be added to the Pattern Library 606 with a designation as an unknown results for the pattern. In one or more embodiments, a simulation be run for the pattern that has not been found in the Pattern Library 606 and the simulation results may be added to the Pattern Library 606 with the pattern.

Embodiments may approximate simulation results for a pattern from similar patterns with known simulation results in the Pattern Library 606. The ability to approximate simulation results for patterns that are similar to each other may reduce the number of patterns that are stored in the Pattern Library 606.

System Architecture Overview

In the following description, numerous details are set forth for purpose of explanation. However, one of ordinary skill in the art will realize that various embodiments of the invention may be practiced without the use of these specific details. In other instances, well-known structures and devices are shown in block diagram form in order not to obscure the description of various embodiments of the invention with unnecessary detail.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method of generating a pattern signature to represent a pattern of an integrated circuit design, comprising:

using a computer system which comprises at least one processor and is programmed for performing:

transforming data of the pattern into a set of one dimensional mathematical functions, wherein
the data of the pattern is two dimensional data for the pattern, and
the act of transforming the data of the pattern comprises projecting one or more two-dimensional objects in the pattern for a plurality of axes in a number of directions and determining which geometric attribute is to be used to represent one or more objects in the pattern;

compressing the set of one dimensional mathematical functions into a single variable function to reduce a number of functions to represent the pattern;

compressing the single variable function by calculating a set of values for the single variable function; and generating a pattern signature for the pattern from the set of values, wherein the pattern signature is used to identify a similar pattern of an integrated circuit design by comparing the pattern signature to at least one other pattern signature.

2. The method of claim 1, wherein the pattern signature is used to retrieve application or simulation results for the similar pattern.

3. The method of claim 1, further comprising:
calculating a metric for differences between the pattern signature and a second pattern signature.

4. The method of claim 1, further comprising:
transforming pattern data into the set of one dimensional mathematical functions by taking projections of geometric objects in the pattern for all axes in a number of different directions.

5. The method of claim 4, further comprising:
determining the projections by performing a Radon Transform.

6. The method of claim 4, further comprising:
merging a first geometric object that is in close proximity to a second geometric object in the pattern into a merged geometric object in the pattern data.

7. The method of claim 1, further comprising:
performing a non-linear combination to create the single variable function.

8. The method of claim 1, wherein the set of values is calculated with a moment method.

9. The method of claim 1, wherein the pattern is a critical part of an integrated circuit design.

10. A computer program product comprising a computer readable storage medium having a sequence of instructions which, when executed by a processor, causes a processor to perform a process for determining a pattern signature for a pattern in an electronic circuit design, the process comprising:

using a computer system which comprises at least one processor and is programmed for performing:
transforming data of the pattern into a set of one dimensional mathematical functions, wherein
the data of the pattern is two dimensional data for the pattern, and
the act of transforming the data of the pattern comprises projecting one or more two-dimensional objects in the pattern for a plurality of axes in a number of directions and determining which geometric attribute is to be used to represent one or more objects in the pattern;

compressing the set of one dimensional mathematical functions into a single variable function to reduce a number of functions to represent the pattern;

compressing the single variable function by calculating a set of values for the single variable function; and generating a pattern signature for the pattern from the set of values, wherein the pattern signature is used to identify a similar pattern of an integrated circuit design by comparing the pattern signature to at least one other pattern signature.

11. A system for generating a pattern signature to represent a pattern of an integrated circuit design, comprising:

at least one processor programmed for transforming data of the pattern into a set of one dimensional mathematical functions, wherein
the data of the pattern is two dimensional data for the pattern, and
the act of transforming the data of the pattern comprises projecting one or more two-dimensional objects in the pattern for a plurality of axes in a number of directions and determining which geometric attribute is to be used to represent one or more objects in the pattern;

means for compressing the set of one dimensional mathematical functions into a single variable function to reduce a number of functions to represent the pattern;

means for compressing the single variable function by calculating a set of values for the single variable function; and means for generating a pattern signature for the pattern from the set of values, wherein the pattern signature is used to identify a similar pattern of an integrated circuit design by comparing the pattern signature to at least one other pattern signature.

12. The system of claim 11, wherein the pattern signature is used to retrieve application or simulation results for the similar pattern.

13. The system of claim 11, further comprising:
means for calculating a metric for differences between the pattern signature and a second pattern signature.

14. The system of claim 11, further comprising:
means for transforming pattern data into the set of one dimensional mathematical functions by taking projections of geometric objects in the pattern for all axes in a number of different directions.

15. The system of claim 14, further comprising:
means determining the projections by performing a Radon Transform.

16. The system of claim 14, further comprising:
means for merging a first geometric object that is in close proximity to a second geometric object in the pattern into a merged geometric object in the pattern data.

17. The system of claim 11, further comprising:
means for performing a non-linear combination to create the single variable function.

18. The system of claim 11, wherein the set of values is calculated with a moment method.

* * * * *